United States Patent [19]

Kuroda et al.

[11] Patent Number: 4,630,091
[45] Date of Patent: Dec. 16, 1986

[54] SOLID STATE IMAGING APPARATUS

[75] Inventors: Takao Kuroda, Ibaraki; Shigenori Matsumoto, Takatsuki; Kenju Horii, Ohtsu; Takahiro Yamada, Hirakata, all of Japan

[73] Assignees: Matsushita Electronics Corporation; Matsushita Electric Industrial Co., Ltd., both of Kadoma, Japan

[21] Appl. No.: 601,928

[22] Filed: Apr. 19, 1984

[30] Foreign Application Priority Data

Apr. 22, 1983 [JP] Japan ................... 58-71914

[51] Int. Cl.$^4$ ................... H01L 27/14; H01L 31/00
[52] U.S. Cl. ................... 357/30; 357/24; 357/41; 358/213; 358/241
[58] Field of Search ................... 357/30, 41, 24 LR; 250/370 R, 370 G, 338 SE, 338 R, 211 J, 578; 358/213, 241

[56] References Cited

U.S. PATENT DOCUMENTS 4,268,845 5/1981 Koike et al. ................... 357/30
4,316,205 2/1982 Aoki et al. ................... 357/30

FOREIGN PATENT DOCUMENTS 0173274 10/1982 Japan ................... 357/30

Primary Examiner—James W. Davie
Assistant Examiner—Georgia Y. Epps
Attorney, Agent, or Firm—Cushman, Darby & Cushman

[57] ABSTRACT

Photoelectric transducing elements are formed in a first impurity-doped region (14), and signal charge reading-out circuits (2, 3) are formed in a second impurity-doped region which is deeper than the first impurity-doped region, so that fixed pattern noise is drastically reduced, improving picture quality.

7 Claims, 10 Drawing Figures

SOLID STATE IMAGING APPARATUS

BACKGROUND OF THE INVENTION

1. Field of the Invention

The present invention relates generally to a solid state imaging apparatus, and particularly to a solid state imaging apparatus of MOS type sensor.

2. Description of the Prior Art

The solid state imaging apparatus has advantages of small type, light weight, high reliability, low power consumption, etc., but on the other hand has such problem as having liability of blooming phenomenon (a phenomenon that when an imaging object is of high brightness, imaging information disappears due to overflowing of excessive charge). In order to overcome the problem, various measures have been tried. Among them, there is a method that utilizes a PN junction as photoelectric transducing part, thereby making a layer including an impurity, which is along the PN junction on a side of substrate with respect to the PN junction. In that method, a depletion layer, which is formed so as to discharge the excessive charges into the substrate, can strongly suppress the blooming.

However, the above-mentioned method has a shortcoming that for exposures above a saturation level a fixed pattern noise is generated, and the process is too much sensitive to the impurity concentration-ununiformity, thereby making process control in mass-production much too complicated.

The above-mentioned shortcoming of the conventional measure of using the depletion part is described more in detail, taking a solid state imaging apparatus of a type called MOS type sensor, wherein MOS transistors are used for reading-out signal charges stored in photoelectric transducing part. In FIG. 1, which is a schematical plan view of a conventional MOS type sensor, a single crystalline wafer comprises a photoelectric transducer part 1 having a number of photoelectric transducer element 5, a vertical scanning circuit 2 and a horizontal shift registor 3, which are all disposed in a same impurity-doped layer 4 of the wafer.

Sectional structure of one unit of picture element of the photoelectric transducer element of FIG. 1 is shown in FIG. 2. In an n-conductivity type substrate 6, a shallow impurity-doped layer 7 of p-conductivity type is formed, and an n+-conductivity type layer 8 is further formed in the shallow p-conductivity type layer. Also, a reading-out drain of n+-conductivity type is formed in the shallow p-conductivity type layer 7 with a channel space 71 between the n+-conductivity type layer 8. A gate 9 of a MOS transistor for reading-out signal charge is made by polycrystalline silicon electrode burred in an oxide film 13 at the part over the channel space 71. A vertical transmission wiring 11 of aluminum is provided to contact the n+-reading-out drain 10. Across the n-conductivity type substrate 6 and the impurity-doped shallow p-conductivity type layer 7, an inverse potential $V_{sub}$ which is over a voltage to deplete the shallow impurity-doped p-type layer 7 is impressed on. A p+-conductivity type channel stopper 12 is provided to surround each one set of the picture element comprising a photodiode part Ph-Di consisting of the substrate 6, the shallow layer 7 and n+-conductivity layer 8 and an FET part consisting of an end part 81 of the n+-conductivity type layer 8, the channel space 71 and the reading-out drain 10. The above-mentioned conventional configuration of the photoelectric transducing element 5 is described with reference to FIG. 3 which schematically shows potential profile along sectional plane A—A' of FIG. 2, illustrating function of suppressing blooming. Immediately after reading-out signal charge by gate 9 of the MOS transistor, the potential of the n+-conductivity type layer 8 is set to a potential $\phi_{AL}$ of the vertical transmission wiring 11. The potential profile at that instant is shown by curve a. Then, as signal charge increases, potential of the n+-conductivity type layer 8 decreases and the profile of the potential becomes as shown by curve b. Then, as the signal charge further increases, the potential of the n+-conductivity type layer 8 comes almost to the lowest potential $\phi_T$ of the impurity-doped p-conductivity type layer 7, and the potential profile at this instant becomes as shown by curve c. Thereafter, when further signal charge flows in, thereafter excessive signal charge is exhausted into the substrate 6 by means of electric field, thereby blooming effect is suppressed. Since the above-mentioned configuration makes excessive signal charge from the n+-conductivity type layer into the conductivity type substrate 6 under the condition of the electric field being impressed, the ability of suppressing of blooming is satisfactory. Level of the lowest potential $\phi_T$ represents minimum potential of the signal charge which can be stored in the n-conductivity type layer. That is, the level of $\phi_T$ defines the maximum amount of signal charge to be stored in the n-conductivity type layer 8 in each set of picture element. When the level of $\phi_T$ is the same in all of the picture elements of the wafer there is no problem, but in actual apparatuses the levels of $\phi_T$ are not necessarily uniform among the picture elements, and hence are likely to produce fixed pattern noise for higher exposures than saturated exposures, since stored signal charges of the n-conductivity type layers 8 of the picture elements are not uniform throughout the wafer. The level of $\phi_T$ is closely influenced by concentration of the impurity-doped p-conductivity type layer 7, which concentration is usually determined by compensation of boron ions or the like implanted into the n-conductivity type substrate 6 on the impurity of opposite conductivity type in the n-conductivity type substrate 6. That is, the impurity concentration of the impurity layer 7 is determined by a difference between the implanted boron concentration and the original concentration of the n-conductivity type substrate 6. While concentration of ions induced by the ion-implantation has good uniformity, impurity concentration of the n-conductivity type substrate 6 of the single crystal made by usual known CZ process or FZ process necessarily has ununiformity of impurity concentration in radial direction due to an ununiformity induced during crystal growth. Accordingly, the resultant impurity concentration of the impurity-doped p-conductivity type layer 7 necessarily reflects concentration ununiformity of the impurity of the substrate. Accordingly, photodiode parts Ph-Di of picture elements throughout the wafer necessarily have ununiformity of saturation level, which causes fixed pattern noise of co-centric pattern, and this pattern noise is problematic in lowering picture quality.

SUMMARY OF THE INVENTION

Accordingly, the present invention purposes to provide an improved solid state imaging apparatus capable of producing picture signal of good quality.

Solid state imaging apparatus in accordance with the present invention comprises:

a semiconductor substrate of one conductivity type, a first region which is provided on a principal surface of the substrate, doped with an impurity to make the other conductivity type and has a set of photoelectric transducing elements therein, and characterized in that a second region, which is provided on the principal surface of the substrate being isolated from the first region and doped with the impurity to make the other conductivity type, contains signal-charge reading-out means therein, and a depth from the principal surface to junction defining a bottom of the second region is selected deeper than the depth of junction defining a bottom of the first region at part immediately under the photoelectric transducing elements.

DESCRIPTION OF THE PREFERRED EMBODIMENTS

Figure 4:
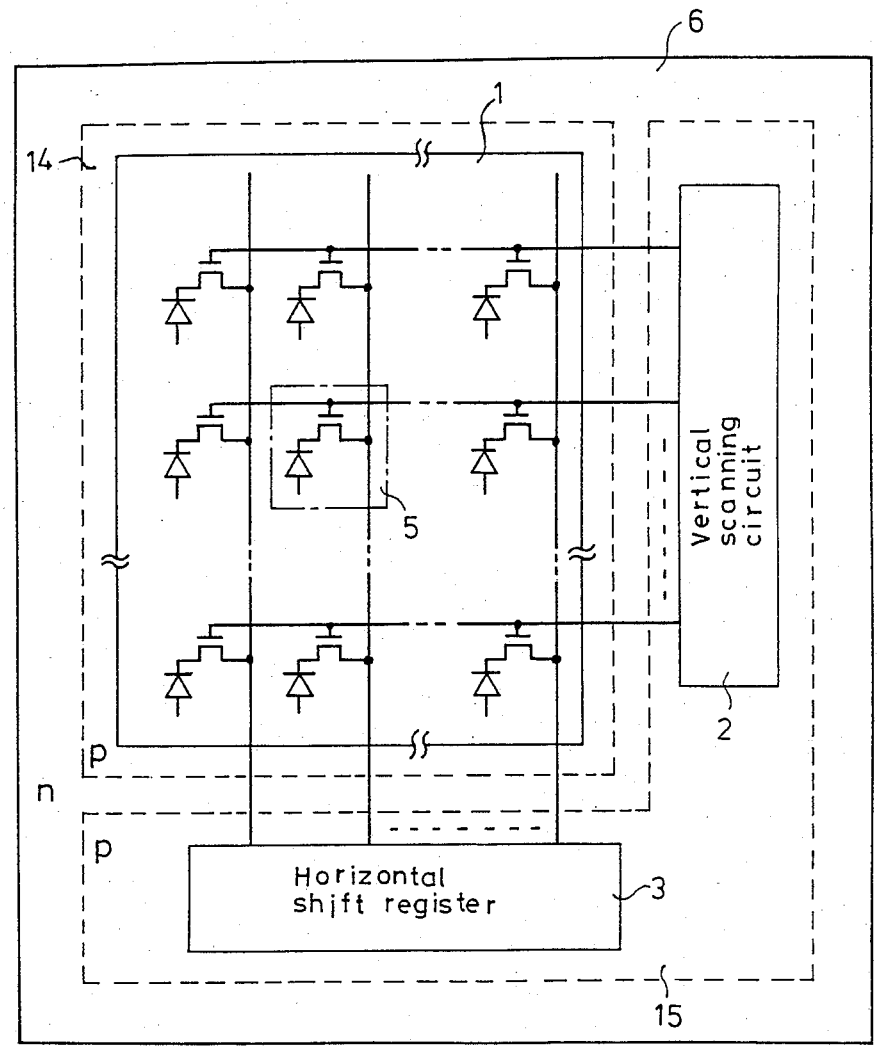
FIG. 4 is a schematical plain view of a MOS type solid state imaging apparatus embodying the present invention.
Figure 5A:
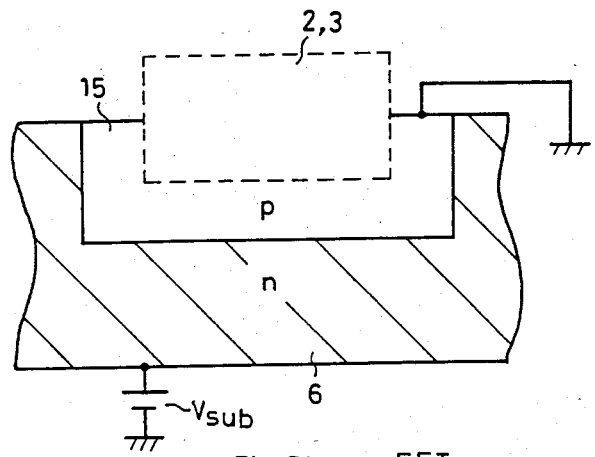
FIG. 5(a) is a sectional elevation view of the solid state imaging apparatus of FIG. 4 at a part of signal reading-out means.

A preferred embodiment is described with reference to FIG. 4, FIG. 5(a) and FIG. 5(b). As shown in FIG. 4, on a semiconductor substrate 6, a first region 14 containing photoelectric transducing elements and of an opposite conductivity type to that of the substrate 6 and a second region 15 having the same conductivity type as that of the first region 14 is formed in isolated relation from the first region 14. The second region 15 comprises a vertical scanning circuit 2 and a first horizontal shift region 3 therein.

Figure 1:
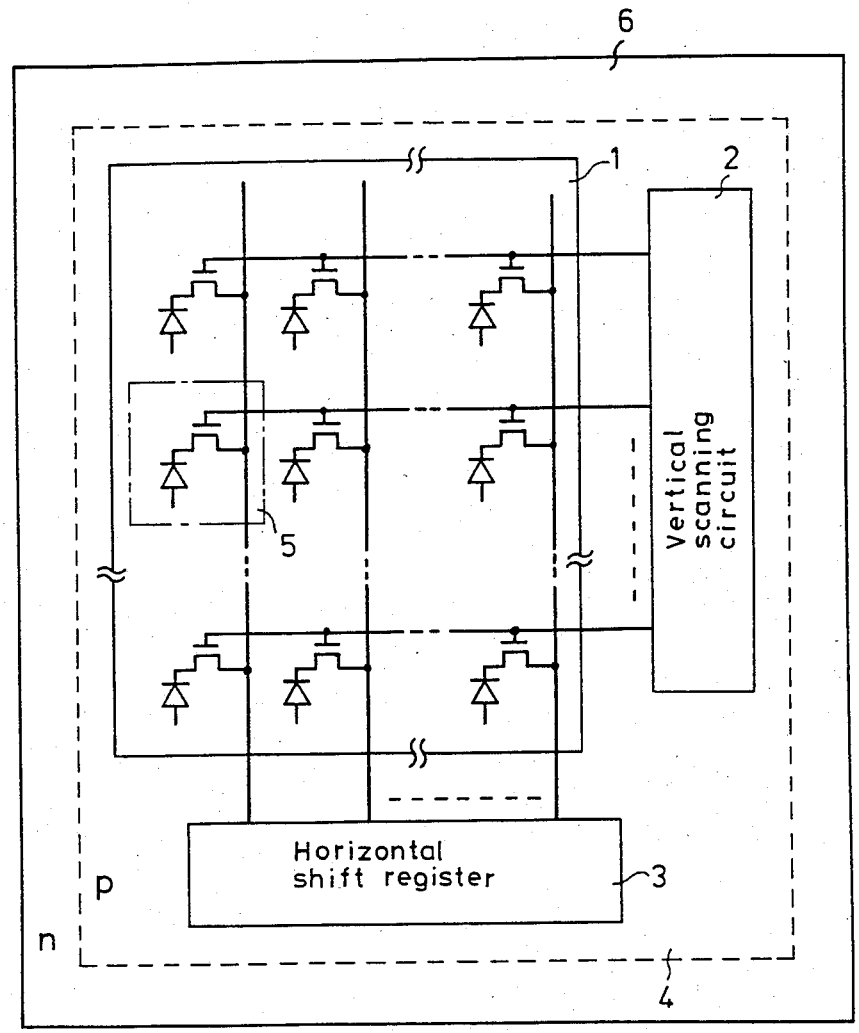
FIG. 1 is the schematic plan view of the MOS type solid state imaging apparatus of the prior art.
Figure 2:
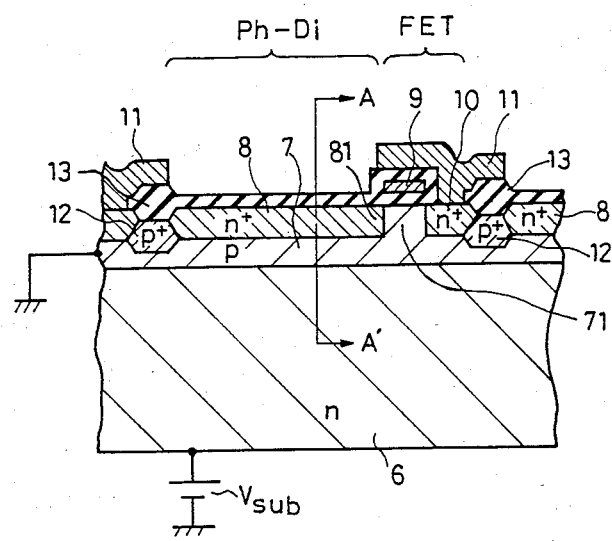
FIG. 2 is the sectional elevation view of the solid state imaging apparatus of FIG. 1.
Figure 3:
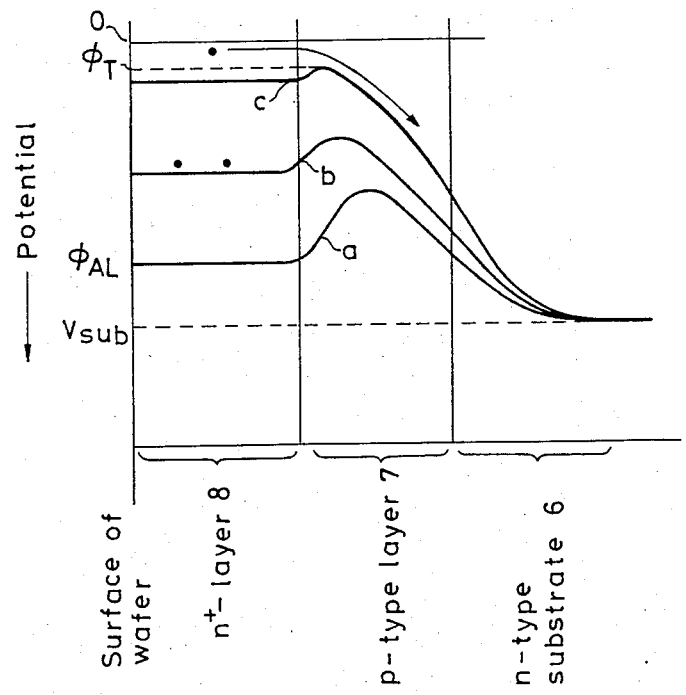
FIG. 3 is the graph showing potential distribution along the cross-sectional plane A—A' shown in FIG. 2.
Figure 5B:
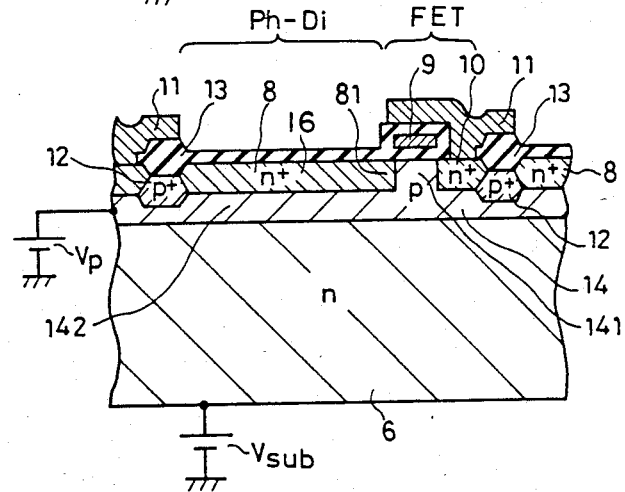
FIG. 5(b) is a sectional elevation view of the solid state imaging apparatus of FIG. 4 at a part of photoelectric transducing elements.

Sectional structure of one unit of picture element of the photoelectric transducer element of FIG. 1 is shown in FIG. 5(b). In an n-conductivity type substrate 6, a shallow impurity-doped layer 14 of p-conductivity type is formed, and an n+-conductivity type layer 8 is further formed in the shallow p-conductivity type layer. Also, a reading-out drain of n+-conductivity type is formed in the shallow p-conductivity type layer 14 with a channel space 141 between the n+-conductivity type layer 8. A gate 9 of a MOS transistor for reading-out signal charge is made by polycrystalline silicon electrode burried in an oxide film 13 at the part over the channel space 141. A vertical transmission wiring 11 of aluminum is provided to contact the n+-reading-out drain 10. Across the n-conductivity type substrate 6 and the impurity-doped shallow p-conductivity type layer 14, an inverse potential $V_{sub}$ which is over a voltage to deplete the shallow impurity-doped p-type layer 7 is impressed on. A p+-conductivity type channel stopper 12 is provided to surround each one set of the picture element comprising a photodiode part Ph-Di consisting of the substrate 6, the shallow layer 14 and n+-conductivity layer 8 and an FET part consisting of an end part 81 of the n+-conductivity type layer 8 as reading-out source, the channel space 141 and the gate 9 thereover and the reading-out drain 10. And, it is the feature of the present invention that the vertical scanning circuit 2 and horizontal shift register 3 are provided in the region 15 having a larger thickness, and the photoelectric transducing elements 5 are provided in a region 14 of a smaller thickness. Impurity-doped regions 14, 15 are provided such that bias potential of the thicker region 15 is 0 V, the thinner region 14 is impressed with a positive bias potential $V_p$, and the n-conductivity type substrate 6 is impressed with such an inverse bias potential $V_{sub}$ as to completely deplete the thinner region 14. The impurity concentration and thickness of the region (depth of the junction face) of the thicker region 15 should be that the inverse potential does not completely deplete it. Incidentally, in the conventional solid state imaging apparatus the bias potential $V_p$ of the thinner region 14 must be $V_p = 0$ V, since the conventional apparatus has the same thickness for the region of the part containing photoelectric transducing elements, and a region containing signal-charge reading-out means.

The below-mentioned table shows performance characteristics of an example made by embodying the present invention.

TABLE

| Case | $V_{sub}$ (V) | $V_p$ (V) | Fixed pattern noise (%) |
|---|---|---|---|
| 1 | 15 | 0 | ±10 |
| 2 | 13 | 1.0 | ±0.8 |
| 3 | 12 | 1.5 | ±0.5 |

Note: Impurity concentration of the n-conductivity type substrate 6 was $1.0 \times 10^{15}$ cm$^{-3}$, and concentration of the shallower region 14 containing the photoelectric transducing elements was $2.0 \times 10^{15}$ cm$^{-3}$, and depth from wafer surface to PN junction defining the bottom of the region 14 was 3 μm.

As is apparent from the table, when comparing case 2 wherein $V_p = 1.0$ and $V_{sub}$ is 13 V, and the case 3 where $V_p = 1.5$ and $V_{sub}$ is 12 V with case 1 wherein $V_p = 0$ and $V_{sub} = 15$ V which corresponds to the prior art operation, the effect of suppressing the blooming are almost identical. With respect to fixed pattern noise which is induced by impurity concentration ununiformity of the n-conductivity type substrate, the prior art case 1 shows the fixed pattern noise of ±10% while the cases 2 and 3 of the present invention show very much suppressed fixed pattern noise of ±0.5–0.8%. The reason of the improvement is supposed that when the n+-conductivity type region 8, p-conductivity type shallow region 14 and n-conductivity type substrate 6 are regarded as the source, the channel and the drain of a transistor, respectively, the potential distribution in the region 16 to become channel in the thin retained p-type region 142 may be changed so that uniformity of the minimum level potential $\phi_T$ may be suppressed by the bias potential $V_p$ of 1.0 or 1.5 V.

According to the present invention, even for a solid state imaging apparatus having such considerable ununiformity of the impurity concentration so as to make it difficult to realize satisfactory operation only by adjusting the substrate potential $V_{sub}$, a satisfactory adjusted operation can be realized by adjusting the potential $V_p$ impressed on the p-conductivity type region 14. Accordingly, this invention enables to greatly improve overall manufacturing yield of the solid state imaging apparatus.

Furthermore, according to the present invention an additional advantage of lowering potential of the driving power is possible.

Figure 6:
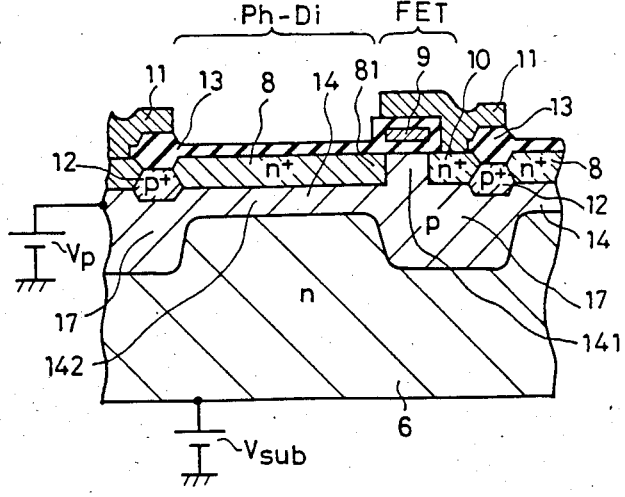
FIG. 6 is a sectional elevation view at a part of photoelectric transducing elements of another embodiment.

FIG. 6 shows another embodiment wherein p-conductivity type region 14 is designed to have thicker part, at the part below the drain region 10. This thicker part 17 is not completely depleted, and accordingly the potential of the thicker part 17 is necessarily lower than the potential of the thinner part 14. Accordingly, signal charges made in the thinner p-conductivity type region 14 does not flows in the drain region, thereby undesirable smearing phenomenon due to direct flowing of the signal charge from the p-conductivity type region 14 to the drain region 10 is eliminated.

Figure 7:
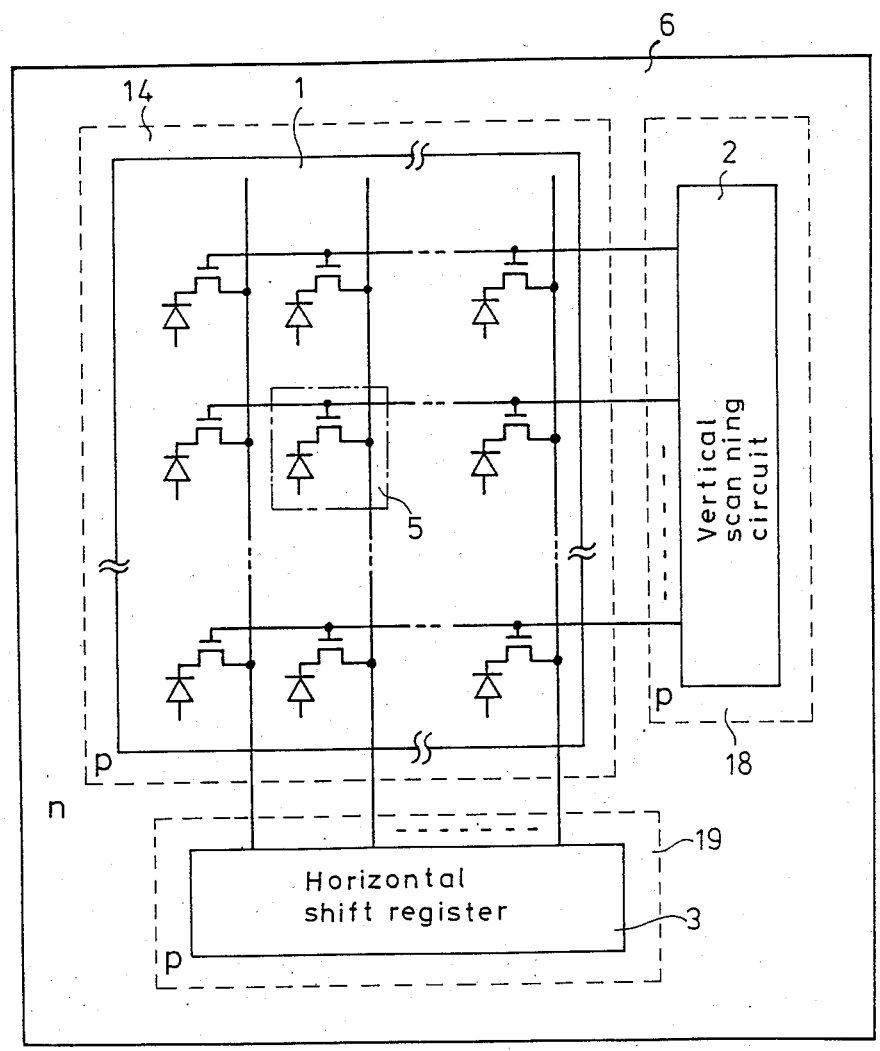
FIG. 7 is a schematic plan view of a solid state imaging apparatus of another embodiment.

FIG. 7 shows another embodiment. In this embodiment, the sectional configuration of the photoelectric transducing elements part is the same as the configuration shown in FIG. 5(b) or FIG. 6, but the plan view configuration has a feature that the second region is divided into two parts 18 and 19, and a vertical scanning circuit 2 is contained in the former second region 18 and the horizontal shift register 3 is contained in the latter second region 19. This configuration is advantageous in that noises from the vertical scanning circuit 2 and from the horizontal shift register 3 do not suffer the other parts, thereby improves the S/N ratios.

When horizontal scanning circuit and horizontal switches are used as the horizontal shift register, the solid state imaging device becomes a MOS type sentor. On the other hand, when charge priming transfer function part and charge-coupled elements are used as the horizontal shift register, then the solid state imaging apparatus becomes a charge priming transfer element type. The present invention is naturally applicable to any type of solid state imaging apparatus having horizontal scanning function or charge transfer function.

The above-mentioned embodiments disclose the apparatus, wherein (1) the first region provided on the substrate and containing photoelectric transducing elements is formed isolated from the second region(s) containing the signal-charge reading-out means, (2) the first region is formed thicker than the second region(s), and (3) a bias potential(s) are impressed on wells of the first region. However, the present invention does not necessarily require these three conditions at the same time.

Figure 8:
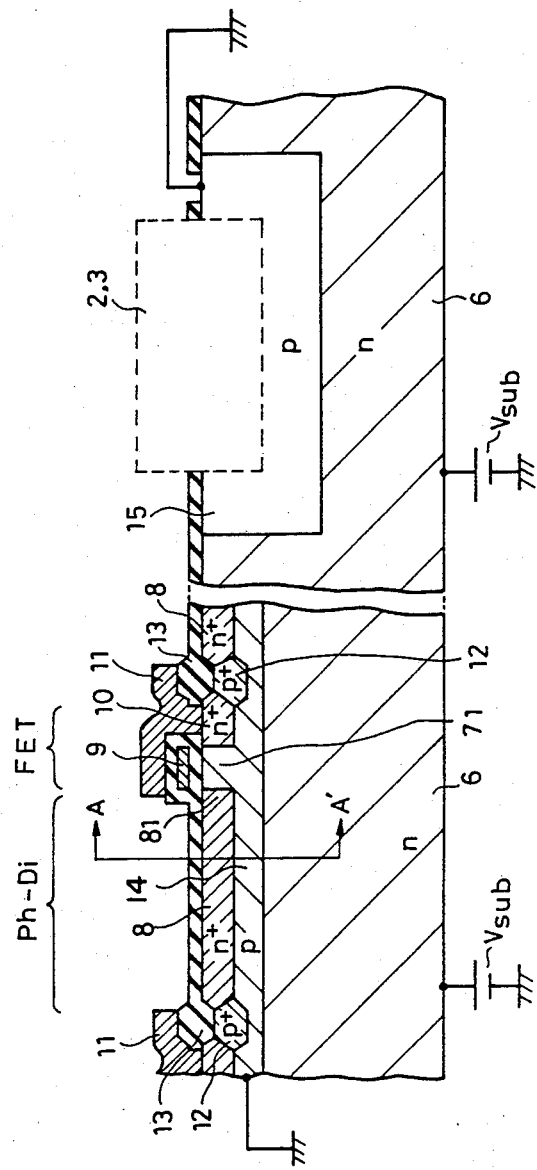
FIG. 8 is a sectional elevation view of still another embodiment.
Figure 9:
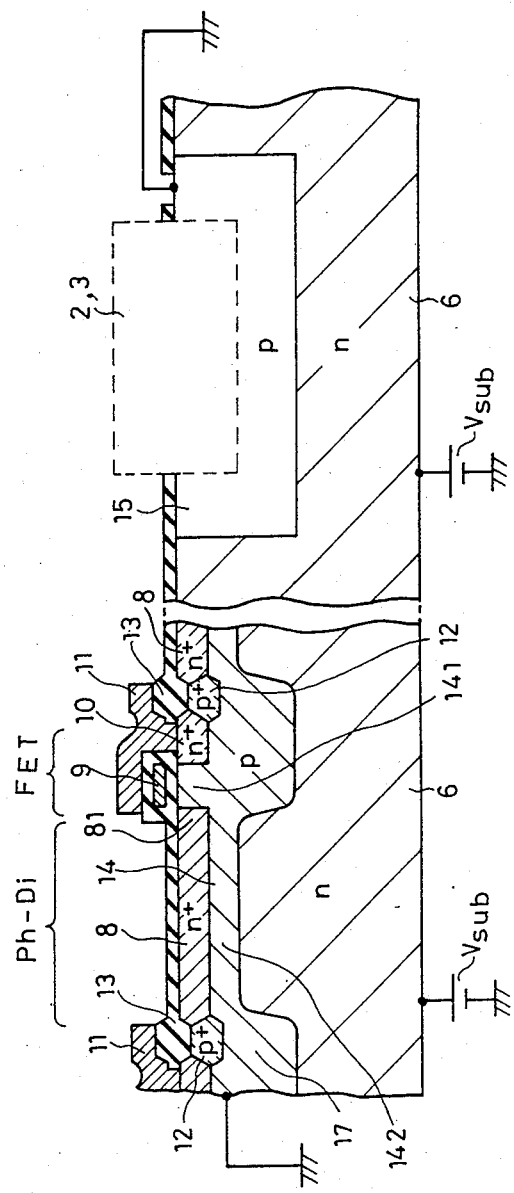
FIG. 9 is a sectional elevation view of still another embodiment.

That is, a solid state imaging apparatus wherein (1) the first region provided on the substrate and containing photoelectric transducing elements is formed isolated from the second region(s) containing the signal-charge reading-out means and (2) the first region is formed thicker than the latter region(s), also has a function to suppress blooming. That is, in this configuration that the retained p-conductivity type region 142 under the photoelectric transducing elements being very thin enables easy flowing of excessive charge towards the substrate, thereby to suppress blooming. FIG. 8 and FIG. 9 are sectional elevation views of such embodiment, wherein the former has a flat shaped PN junction between the substrate 6 and the p-conductivity type region 14, and the latter has thickened part 17 under the gate 9. This configuration is advantageous in that no noises from vertical scanning circuit 2 and the horizontal shift register 3 do not go into the photoelectric transducing elements 5, and accordingly the SN ratio is improved. Furthermore, in this configuration, even when potential of the second region(s), 15, 18+19 fluctuates due to driving pulse of the signal-charge reading-out means, the PN junction under the photoelectric transducing elements isolate the photoelectric transducing elements 5 from the potential fluctuation of the second region(s) 15, 18+19.

As a result, fluctuation of dynamic range of the photoelectric transducing elements 5 can be suppressed.

What is claimed is:

1. In a solid state imaging apparatus the improvements comprising:
    a semiconductor substrate of one conductivity type,
    a first region which is provided on a principal surface of said substrate, doped with an impurity to make the other conductivity type and has a set of photoelectric transducing elements therein,
    characterized in that
    a second region, which is provided on said principal surface of said substrate being isolated from said first region and doped with said impurity to make said other conductivity type, contains signal-charge reading-out means therein, and
    depth from said principal surface to a junction defining a bottom of said second region is deeper than the depth from said principal surface of a junction defining a bottom of said first region at a part immediately under said photoelectric transducing elements.

2. A solid state imaging apparatus in accordance with claim 1, wherein
    said first region contains vertical read-out means and said junction of a part of said first region which is immediately under said vertical read-out means is deeper than the junction which is immediately under $\phi$ said photoelectric transducing elements.

3. A solid state imaging apparatus in accordance with claim 1, wherein
    said second region is divided into a third part containing a vertical scanning circuit and a fourth part containing a horizontal scanning or transferring circuit.

4. In a solid state imaging apparatus comprising:
    a semiconductor substrate of one conductivity type,
    a first region which is provided on a principal surface of said substrate, doped with an impurity to make the other conductivity type and has a set of photoelectric transducing elements therein,
    characterized in that
    a second region, which is provided on said principal surface of said substrate being isolated from said first region and doped with said impurity to make said other conductivity type, contains signal-charge reading-out means therein,
    bias-feeding means for feeding bias potential to at least one of said first and second regions, and
    depth from said principal surface to a junction defining a bottom of said second region is deeper than the depth from said principal surface of a junction defining a bottom of said first region at a part immediately under said photoelectric transducing elements.

5. A solid state imaging apparatus in accordance with claim 4, wherein
said first region contains vertical read-out means and said junction of a part of said first region which is immediately under said vertical read-out means is deeper than the junction which is immediately under $\phi$ said photoelectric transducing elements.

6. A solid state imaging apparatus in accordance with claim 4, wherein
said second region is divided into a third part containing a vertical scanning circuit and a fourth part containing a horizontal scanning or transferring circuit.

7. A solid state imaging apparatus in accordance with claim 4, wherein
said bias-feeding means comprises
a first bias-feeding means for feeding across said first region at the part immediately under said photoelectric transducing elements and said semiconductor substrate with such an inverse bias potential as is necessary to deplete said first region, and
a second bias-feeding means for feeding across said second region and said semiconductor substrate with such an inverse bias potential as is larger than that of said first bias-feeding means.

* * * * *